(12) United States Patent
Jang et al.

(10) Patent No.: US 8,330,349 B2
(45) Date of Patent: Dec. 11, 2012

(54) YELLOW EMITTING CE3+ DOPED CALCIUM SILICATE PHOSPHOR AND WHITE LIGHT EMITTING DIODES INCLUDING CE3+ DOPED CALCIUM SILICATE PHOSPHOR

(75) Inventors: Ho Seong Jang, Daejeon (KR); Duk Young Jeon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 1057 days.

(21) Appl. No.: 12/239,947

(22) Filed: Sep. 29, 2008

(65) Prior Publication Data

US 2009/0085467 A1    Apr. 2, 2009

(30) Foreign Application Priority Data

Sep. 28, 2007   (KR) .................. 10-2007-0098275

(51) Int. Cl.
*H01J 1/62* (2006.01)
*H01J 63/04* (2006.01)
(52) U.S. Cl. ............ 313/502; 252/301.4 R; 252/301.4 F
(58) Field of Classification Search ............ 252/301.4 F, 252/301.4 R; 313/502
See application file for complete search history.

(56) References Cited

U.S. PATENT DOCUMENTS

| | | | |
|---|---|---|---|
| 5,998,925 A | 12/1999 | Shimizu et al. | |
| 6,084,250 A | 7/2000 | Jüstel et al. | |
| 7,928,648 B2 * | 4/2011 | Jang et al. | 313/503 |
| 2006/0012284 A1 | 1/2006 | Kim et al. | |
| 2006/0022208 A1 | 2/2006 | Kim et al. | |
| 2008/0001122 A1 * | 1/2008 | Odaki et al. | 252/301.5 |
| 2009/0001319 A1 * | 1/2009 | Liu et al. | 252/301.4 R |

FOREIGN PATENT DOCUMENTS

JP   2005-330348   *  2/2005

OTHER PUBLICATIONS

English-language abstract for: Masami, K., JP 2005-330348, Patent Abstracts of Japan (2005) (listed on accompanying PTO/SB/08A as document FP1).
Nakamura, S. et al., "The Blue Laser Diode: The Complete Story," 1st Ed, p. 216-219, Springer-Verlag, New York (1997).

* cited by examiner

*Primary Examiner* — Carol M Koslow
*Assistant Examiner* — Matthew Hoban
(74) *Attorney, Agent, or Firm* — Sterne, Kessler, Goldstein & Fox P.L.L.C.

(57) ABSTRACT

The present invention is directed to phosphors and white light emitting diodes and a method for preparing a $Ce^{3+}$ doped calcium silicate phosphor represented by a chemical formula of $(Ca_{1-y}M_y)_{2-x-z}SiO_4:Ce^{3+}{}_x,N^+{}_z$, wherein x is $0<x\leqq0.5$, y is $0\leqq y\leqq0.5$, z is $0<z\leqq0.5$, M is at least one metal selected from Mg, Sr and Ba, and N is at least one metal selected from Li, Na, K and Rb, as well as white LEDs produced comprising the same. The phosphor of the present invention can be excited using conventional InGaN-based blue light emitting diodes, as well as GaN-based near-UV light emitting diodes to emit light across the visible spectrum.

2 Claims, 5 Drawing Sheets

… (US 8,330,349 B2)

YELLOW EMITTING CE3+ DOPED CALCIUM SILICATE PHOSPHOR AND WHITE LIGHT EMITTING DIODES INCLUDING CE3+ DOPED CALCIUM SILICATE PHOSPHOR

CROSS-REFERENCE TO RELATED APPLICATIONS

This application claims priority to Korean Patent Application No. 10-2007-98275, filed Sep. 28, 2007, which is incorporated herein by reference in its entirety.

BACKGROUND OF THE INVENTION

1. Field of the Invention

The present invention relates to $Ce^{3+}$ doped silicate based phosphors and white light emitting diodes including $Ce^{3+}$ doped silicate based phosphors, more particularly, to a $Ce^{3+}$ doped silicate based phosphor with superior emission efficiency when applied to light emitting diodes and/or active light emission type liquid crystal displays, characterized in that the phosphor is formed by adding cerium oxide ($CeO_2$) as an activating ingredient to a calcium silicate base and heat treating the mixture under specific conditions, as well as its preparation method and white light emitting diodes manufactured using the same.

2. Background

White light emitting diodes ("white LEDs") are well known as one of future light emitting devices capable of replacing traditional fluorescent or incandescent lighting devices. White LEDs are superior to conventional lighting devices due to their reduced power consumption requirements, higher light emission efficiency, high brightness, extended lifetime of use, and short response time.

White LEDs are generally manufactured by three kinds of methods including: a method for mounting together three different diodes with red, green and blue light emission, respectively; a method for coating all of red, green and blue light emitting phosphors on a near-UV LED; and a method for coating a yellow emitting phosphor on a blue LED.

For the first method for mounting together all of three diodes with red, green and blue light emission, respectively, a light emitting device is formed using three chips and requires alternative semiconductor thin films to manufacture separate LEDs with blue, green and red light emission, and it causes increase of investment cost in a process for manufacturing LEDs and unit price of the product.

The second method for coating three phosphors with red, green and blue light emission, respectively, on a near-UV LED was disclosed in International Patent Publication No. WO 98/039805. This is the most preferable method to generate R-G-B type white light by transmitting UV light to phosphors for three primary colors. However, the prepared LED excessively emits heat and has poor emission efficiency. There is still a requirement for developing novel phosphors with improved light emission efficiency for near-UV light. For instance, products available from NICHIA Co., or Toyoda Gosei Co., Ltd., Japan, also have small output power of only 2 to 3 mW. Since transparent resins for coating near-UV LED chip have not yet been developed, organic resins are mostly used at present to cover the chip. Such organic resins absorb UV light and are deteriorated by UV light, which reduces the lifetime and quality of LEDs comprising these materials.

The third method for preparing white LEDs comprises coating yellow light emitting phosphors on a blue LED, which has been widely and intensively investigated. This method has advantages such as easy production of diodes with simple structures and emission of white light with high brightness. This method has been described in detail in International Patent Publication No. WO 98/05078 owned by NICHIA Co., as well as a by S. Nakamura et al., "The Blue Laser Diode," Springer-Verlag, p. 216-219 (1997). White LEDs prepared by this method operate as follows: blue light emitted from a LED is first absorbed in a phosphor composed of yttrium-aluminum-garnet ($Y_3Al_5O_{12}$:$Ce^{3+}$, referred to herein as "YAG"), which then emits yellow light to form white light by combination of the blue and yellow spectral regions. However, YAG-based light emitting phosphors have problems including a relatively weak emission strength in the red (long wavelength) spectral region due to characteristics of light emission wavelength, and color-dependent sensitivity to temperature. These problems may be an obstacle to achieving adequate color rendering features, and make the phosphor unsuitable for use in general lighting and/or light source for backlight units of color liquid crystal display panels.

With regard to the above description, Korea Research Institute of Chemical Technology reported $Eu^{2+}$-doped strontium silicate phosphor ($Sr_3SiO_5$:$Eu^{2+}$) in Korean Patent Laid-Open No. 2004-0085039. However, since the phosphor has a center wavelength of about 570 nm with a narrow emission bandwidth and emits orange light rather than yellow light, there is a problem of not being able to emit white light with high color temperature of more than 6500 K when the phosphor is combined with a blue LED. Alternatively, Korea Research Institute of Chemical Technology reported $Eu^{2+}$-doped $Sr_2SiO_4$ phosphor in Korean Patent Laid-Open No. 2004-0069547, but here also the phosphor exhibited poor color rendering features due to a narrow emission bandwidth.

SUMMARY OF THE INVENTION

What is needed are yellow light emitting phosphors with broader emission bandwidths. Accordingly, the present invention is directed to solving problems of conventional techniques as described above and, an object of the present invention is to provide $Ce^{3+}$ doped calcium silicate phosphor having light emission wavelength in a wider region, preferably, in a region ranging from about 500 nm to about 700 nm, which is excited by a blue light emitting diode based on gallium nitride (GaN) and zinc oxide (ZnO).

Another object of the present invention is to provide a process for manufacturing white LEDs by using the above phosphors.

Yet another object of the present invention is to provide $Ce^{3+}$ doped calcium silicate phosphors represented by a chemical formula of $(Ca_{1-y}M_y)_{2-x-z}SiO_4$:$Ce_x^{3+}$,$N_z^+$, wherein, x is $0<x\leq0.5$, y is $0\leq y\leq0.5$, z is $0<z\leq0.5$, M is at least one metal selected from Mg, Sr and Ba, and N is at least one ion selected from Li, Na, K and Rb.

A further object of the present invention is to provide white LEDs including Ce3+ doped calcium silicate phosphors $((Ca_{1-y})_{2-x-z}SiO_4$:$Ce_x^+$,$N_z^+)$ which are excited by near-UV LEDs as well as blue LEDs to emit yellow light.

Still a further object of the present invention is to provide a phosphor that exhibits a light emission spectrum with a wider wavelength range, compared to conventional phosphors, and that can embody white light by using near-UV LEDs as well as blue LEDs.

In order to achieve the above objects, there is provided a $Ce^{3+}$ doped calcium silicate phosphor represented by chemical formula (1):

$$(Ca_{1-y}M_y)_{2-x-z}SiO_4:Ce_x^{3+},N_z^+ \quad (1),$$

wherein x is $0<x\leq0.5$, y is $0\leq y\leq0.5$, z is $0<z\leq0.5$, M is at least one metal selected from Mg, Sr and Ba, and N is at least one metal selected from Li, Na, K and Rb.

The present invention provides a process for production of $Ce^{3+}$ doped calcium silicate phosphors, comprising: preparing a mixture of calcium carbonate ($CaCO_3$), alkali-earth metal carbonate or alkali-earth metal oxides, alkali metal carbonate or alkali metal fluorides or alkali metal chlorides, silicon dioxide ($SiO_2$) and cerium oxide ($CeO_2$); drying the mixture; reduction reacting the dried mixture under a reduction atmosphere; and heat treating the reduction product.

Alkali-earth metal carbonate is represented by $MCO_3$ while alkali-earth metal oxides are MO, wherein M means at least one metal selected from a group consisting of alkali-earth metal elements.

Alkali metal carbonate is represented by $N_2CO_3$ while alkali metal fluorides are NF and alkali metal chlorides are NCl, wherein N means at least one metal selected from a group consisting of alkali metal elements.

Temperatures for drying the mixture are not particularly limited and can range from about 80° C. to about 150° C., about 80° C. to about 140° C., about 80° C. to about 120° C., about 100° C. to about 150° C., or about 120° C. to about 150° C.

Temperatures for heat treatment the mixture are also not particularly limited and can range from about 800° C. to about 1600° C., about 800° C. to about 1500° C., about 800° C. to about 1400° C., about 900° C. to about 1600° C., about 1000° C. to about 1500° C., about 1100° C. to about 1500° C., or about 1200° C. to about 1500° C.

The reduction atmosphere for reducing reaction of the mixture means an external environment for reaction of the mixture in gaseous condition, and is not particularly limited so far as the external environment is a gaseous atmosphere under which the mixture is subjected to the reducing reaction. The reduction atmosphere can be a gas mixture of nitrogen and hydrogen and can contain hydrogen in the range of about 2% to about 25%, about 2% to about 20%, about 2% to about 15%, about 5% to about 25%, about 10% to about 25%, or about 15% to about 25% by volume.

LED containing $Ce^{3+}$ doped calcium silicate phosphor of the present invention can include a blue LED chip or another LED chip emitting light with shorter wavelength than that of blue light, and a phosphor which is excited by light emitted from the LED chip and is represented by $(Ca_{1-y}M_y)_{2-x-z}SiO_4$: $Ce_x^{3+}, N_z^+$, wherein x is $0<x\leq0.5$, y is $0\leq y\leq0.5$, z is $0<z\leq0.5$, M is at least one metal selected from Mg, Sr and Ba, and N is at least one metal selected from Li, Na, K and Rb.

The diode chip emitting light with shorter wavelength than that of blue light can comprise near-UV LED chips or violet LED chips, but is not particularly limited thereto so far as this is a chip to emit light with shorter wavelength than that of blue light.

In some embodiments, the LED chip can have a main peak emission wavelength of about 400 nm to about 470 nm, about 420 nm to about 470 nm, or about 420 nm to about 450 nm.

The LED of the present invention can have an emission band ranging from about 420 nm to about 800 nm when the phosphor is excited by light emitted from a LED chip.

Light emitted from the LED of the present invention can be represented by the wavelength band ranging from about 380 nm to about 800 nm and, especially, an LED of the present invention comprising a LED chip that emits blue light can have a light emission band in a wavelength region from about 420 nm to about 800 nm. In some embodiments, an LED of the present invention comprising a LED chip that emits light having a wavelength shorter than that of blue light can have a light emission band in a wavelength region from about 380 nm to about 800 nm.

BRIEF DESCRIPTION OF THE DRAWINGS

These and other objects, features, aspects, and advantages of the present invention will be more fully described in the following detailed description of embodiments and examples, taken in conjunction with the accompanying drawings. In the drawings.

Figure 1:
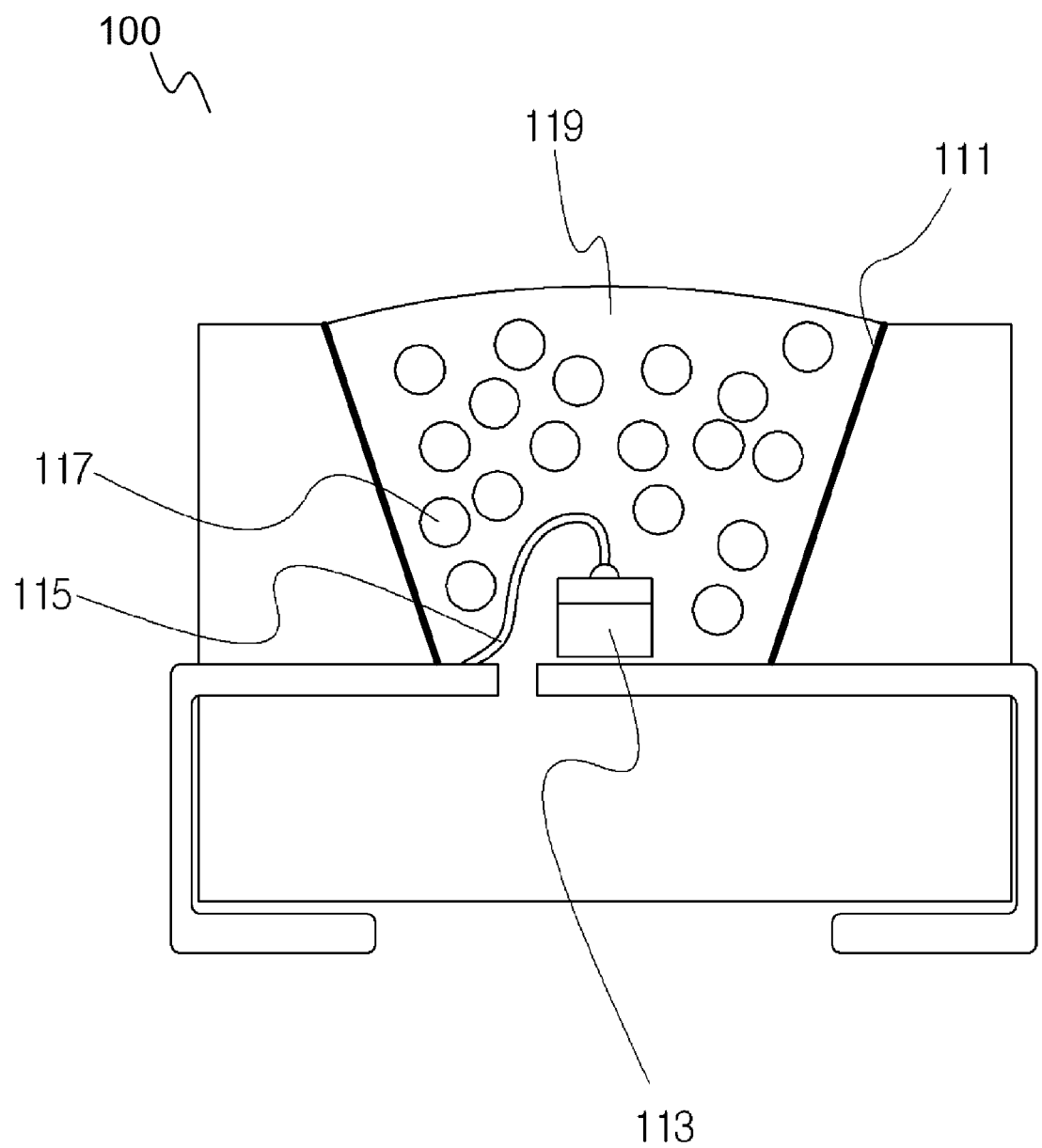
FIG. 1 is a schematic view showing a LED of the present invention comprising a $Ce^{3+}$ doped calcium silicate phosphor according to the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

References to spatial descriptions (e.g., "above," "below," "up," "down," "top," "bottom," etc.) made herein are for purposes of description and illustration only, and should be interpreted as non-limiting upon the LEDs, phosphors, coatings, methods, and products of any method of the present invention, which can be spatially arranged in any orientation or manner.

The present invention will be described in detail below.

The inventive phosphor represented by $(Ca_{1-y}M_y)_{2-x-z}SiO_4:Ce_x^{3+},N_z^+$, comprises a base composed of Ca and Si, and $Ce^{3+}$ as an activating agent. If an amount of $Ce^{3+}$ is less than 0.001 wt. %, this cannot function as the activating agent. On the other hand, with more than 0.5 wt. % of $Ce^{3+}$, the phosphor is not desirable because brightness of the phosphor is considerably decreased due to concentration quenching effect.

Raw materials of the phosphor according to the present invention include metal carbonates (e.g., calcium, magnesium, strontium, barium carbonate, and the like), silicon oxide ($SiO_2$) and cerium oxide ($CeO_2$).

Also, since $Ce^{3+}$ replaces $Ca^{2+}$ position, monovalent alkali metal element N is used for substitution in order to compensate charge difference between $Ce^{3+}$ and $Ca^{2+}$, wherein, if N is Li (lithium) or Na (sodium), z of the above chemical formula can be $0<z\leq0.3$ while z can range from $0<z\leq0.5$ when N is K (potassium).

Hereinafter, a method for preparation of the phosphor according to the present invention will be more particularly described by the preferred examples with reference to the accompanying drawings. However, these are intended to illustrate the invention as preferred embodiments of the present invention without limitation of the scope of the present invention and, it will be understood by those skilled in the art that various modifications and variations may be made by addition or substitution of constructional elements of the present invention.

Particular embodiments of the method for preparation of $Ce^{3+}$ doped silicate phosphors according to the present invention will be described below.

First, after weighing all of the compounds including at least one of a metal carbonate (e.g., $CaCO_3$), an alkali-earth metal carbonate (e.g., $MCO_3$), or an alkali-earth metal oxide (MO); at least one of an alkali metal carbonate ($N_2CO_3$), an alkali metal fluoride (e.g., NF), or an alkali metal chloride (e.g., NCl); a silicon oxide (e.g., $SiO_2$) and a cerium oxide (e.g., $CeO_2$), the compounds are blended together in a desired solvent.

More particularly, the above compounds are weighed in a desired ratio of constitutional compositions and a solvent is added. Solvents suitable for use with the present invention include, but are not limited to, ethanol, methanol, propanol, and the like. In the presence of a solvent (e.g., ethanol), separate compounds are homogeneously mixed together using a mixer such as ball milling or a gate mortar and pestle sets.

In order to achieve a uniform composition of the mixture, the compounds are sufficiently mixed together using the mixer and the mixture is dried in an oven at about 80° C. to about 150° C., about 80° C. to about 140° C., about 80° C. to about 120° C., about 100° C. to about 150° C., or about 120° C. to about 150° C. for about 1 hour to about 24 hours, about 1 hour to about 12 hours, about 1 hour to about 6 hours, about 3 hours to about 24 hours, about 6 hours to about 24 hours, about 10 hours to about 24 hours.

Further, the dried mixture is introduced into a high purity alumina tube and this tube is place in an electric furnace and heat treated under a reduction atmosphere (e.g., an atmosphere containing a hydrogen-nitrogen gas mixture). Herein, if heat treatment temperature is below 800° C., single crystals of $Ce^{3+}$ doped calcium silicate may not completely form, thereby causing light emission efficiency to be reduced. On the other hand, when the temperature is higher than 1600° C., brightness of the product can be severely decreased due to over-reaction. Therefore, the heat treatment temperature can range from about 800° C. to about 1600° C., about 800° C. to about 1500° C., about 800° C. to about 1400° C., about 900° C. to about 1600° C., about 1000° C. to about 1500° C., about 1100° C. to about 1500° C., or about 1200° C. to about 1500° C. The heat treatment time can range from about 1 hour to about 36 hours, about 1 hour to about 24 hours, about 1 hour to about 18 hours, about 3 hours to about 36 hours, about 6 hours to about 36 hours, about 12 hours to about 36 hours, or about 24 hours to about 36 hours.

In some embodiments, the reduction atmosphere comprises a hydrogen and nitrogen gas mixture containing hydrogen gas in the range of about 2% to about 25%, about 2% to about 20%, about 2% to about 15%, about 5% to about 25%, about 10% to about 25%, or about 15% to about 25% by volume.

After heating, the mixture is cooled to room temperature and sufficiently pulverized to produce a phosphor in a powder state having a desired diameter ranging from about 5 μm to about 20 μm. Such produced phosphor is applied to a blue LED chip having an emission wavelength in the range of about 400 nm to about 470 nm, which was made of GaN, ZnO or the like. After combining about 1 wt-% to about 40 wt-% of phosphor with epoxy resin or silicon resin, the resin mixture can be applied to the blue LED chip and the coated chip can be cured at about 130° C. to about 200° C. or about 150° C. to about 200° C. to completely manufacture a white LED.

EXAMPLE 1

Preparation of $Ce^{3+}$ Doped Silicate Phosphor

In order to particularly embody this example of the present invention, after weighing $CaCO_3$, $SiO_2$, $CeO_2$ and $Li_2CO_3$, these compounds were mixed together in ethanol as a solvent by means of ball milling or a gate mortar and pestle sets to achieve a uniform composition of the mixture. The mixture was dried in an oven at 120° C. for 24 hours and heat treated at 1350° C. for 36 hours. In order to form a desired reduction atmosphere, a hydrogen-nitrogen gas mixture containing 2 vol-% to 25 vol-% of hydrogen gas was used. From such an experiment procedure, $Ce^{3+}$ doped calcium silicate yellow phosphor with a chemical formula of $Ca_{1.968}SiO_4$:$(Ce^{3+})_{0.016}$,$(Li^+)_{0.016}$ was obtained. The prepared phosphor as well as an InGaN LED chip having a main peak at about 455 nm were use to manufacture a white LED as shown in FIG. 1.

FIG. 1 is a schematic view showing a structure of a white light emitting diode according to the present invention, prepared using a blue LED chip or a near-UV LED chip. Referring to FIG. 1, the white LED (100) comprising a blue LED chip or a near-UV LED chip comprises: a reflection cup (111); an LED chip (113) (e.g., an InGaN-based LED chip or a GaN-based LED chip) mounted within the reflection cup (111); a phosphor (117) that can be excited by light emitted from the LED chip (113); an electrode line (115) connected to the LED chip (113); and a light transmitting medium (e.g., an epoxy resin or a silicon resin) (119) to seal and fix the LED chip (113) within the reflecting cup (111). In some embodiments, the LED chip (113) can be connected to an external power source through the electrode line (115). The phosphor (117) is excited by light emitted from the LED chip (113). In some embodiments, the phosphor (117) is combined with a light-transparent resin (119) and the mixture is applied to an outer side of the LED chip (113). However, construction of the inventive LED is not particularly limited to this embodiment and may be modified and/or varied by addition, alteration and/or deletion of constructional elements according to conventional techniques in the art.

Manufacture of a white LED comprising a near-UV emitting LED chip can be performed using the same procedure as described above. An appropriate light transmitting resin should be used in combination with a near-UV light emitting diode chip (e.g., silicon resin). Referring to FIG. 1, in some embodiments, a phosphor of the present invention (117) is coated over an outer side of a InGaN-based LED chip (113) to allow light emitted from a light emitting layer of the InGaN-based LED chip (113) to serve as an excitation light of the phosphor (117). The InGaN-based LED chip (113) generates blue light having a main peak at about 455 nm, and the phosphor (117) excited by the InGaN-based LED chip (113) comprises $Ce^{3+}$ doped calcium silicate phosphor with the formula of $Ca_{1.968}SiO_4:(Ce^3)_{0.016},(Li^+)_{0.016}$.

With regard to a process for producing white light using a LED of the present invention, blue light having a wavelength of about 455 nm is emitted from a InGaN-based LED chip and passed through a $Ce^{3+}$ doped calcium silicate phosphor. A portion of the light excites the $Ce^{3+}$ doped calcium silicate phosphor, which emits light having an emission maximum in the yellow region of the visible spectrum, while a portion of the blue light emitted from the LED chip is directly transmitted from the LED. Therefore, as described above, yellow light emitted from the phosphor of the present invention combined with blue light transmitted through the yellow phosphor overlap to provide white light emission from the LED.

Figure 2:
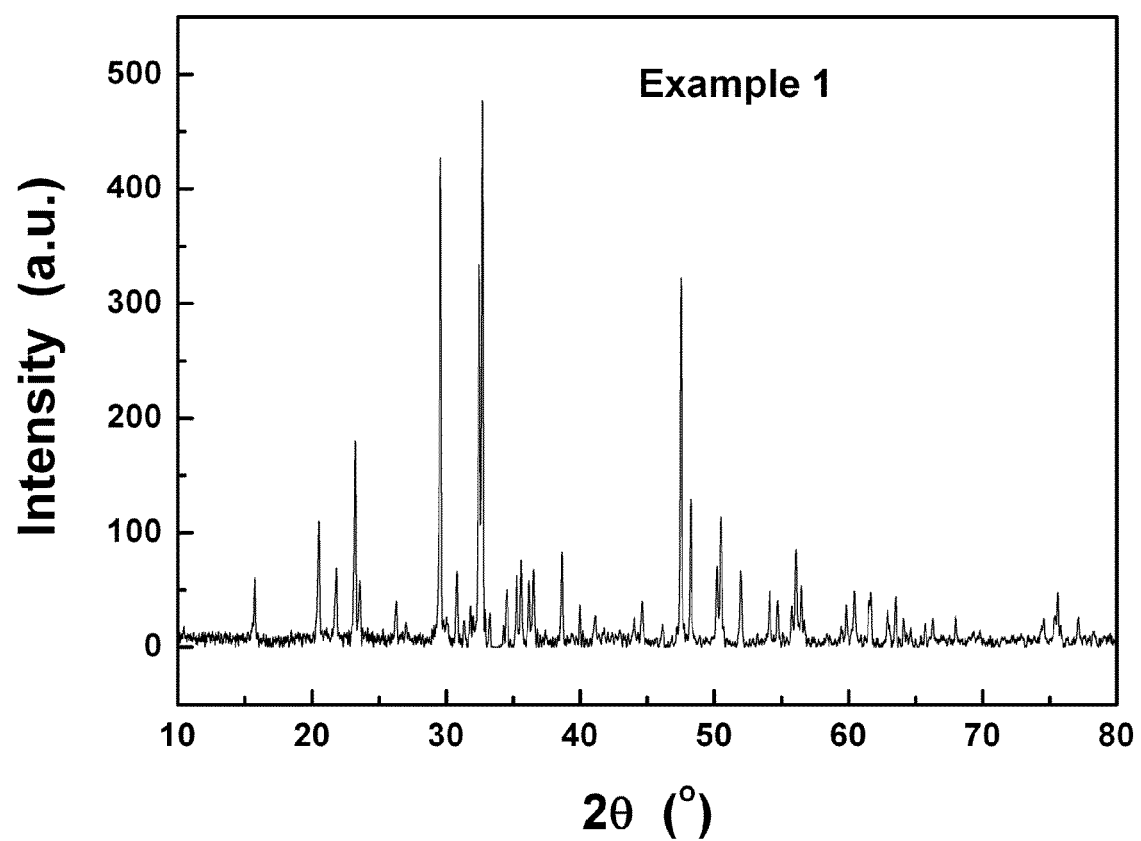
FIG. 2 is a graph showing XRD pattern of $Ce^{3+}$ doped calcium silicate phosphor according to the present invention.

FIG. 2 provides a x-ray diffraction ("XRD") pattern of the yellow light emitting $Ce^{3+}$ doped calcium silicate phosphor according to the present invention. Referring to FIG. 2, it was found that the phosphor of the present invention comprises calcium silicate having an orthorhombic phase.

Figure 3:
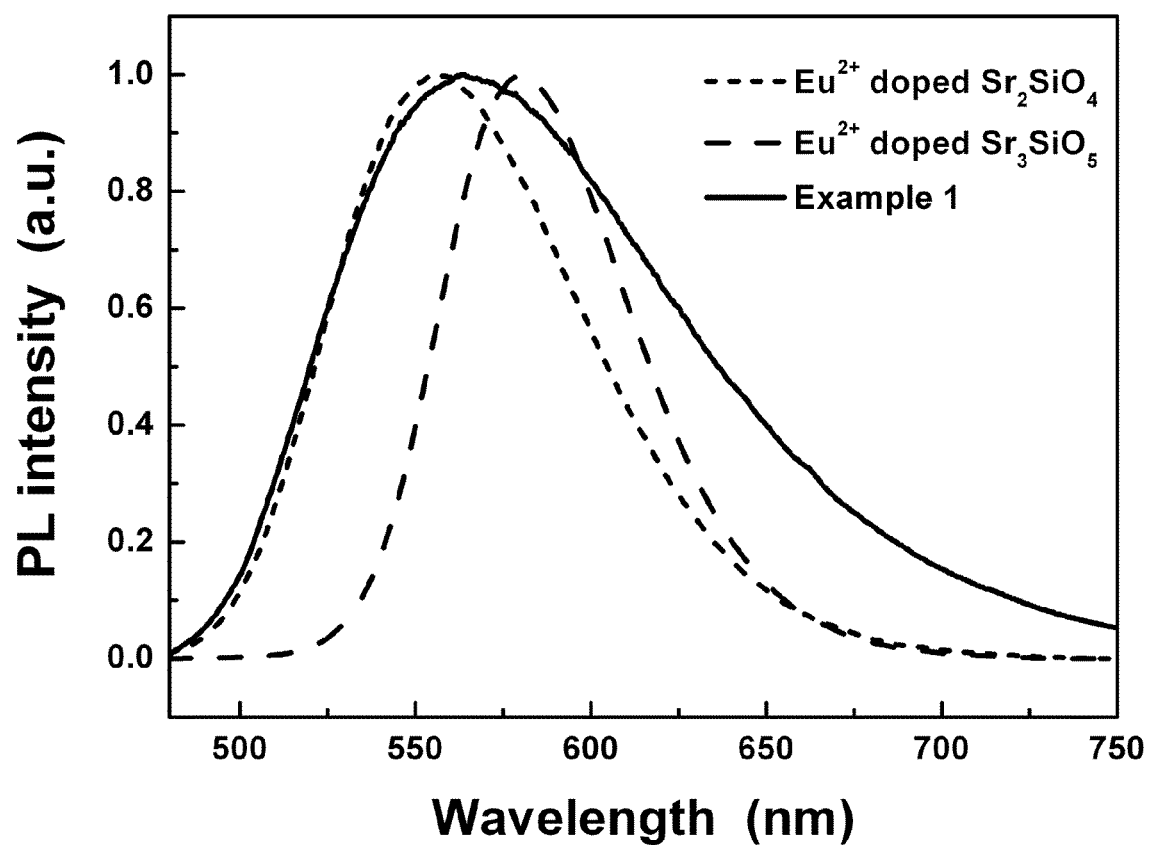
FIG. 3 is a graph showing light emission spectra of $Ce^{3+}$ doped calcium silicate phosphor according to the present invention, and conventional $Eu^{2+}$ doped $Sr_2SiO_4$ phosphor and $Eu^{2+}$ doped $Sr_3SiO_5$ phosphor, respectively.

FIG. 3 provides a graphic representation of normalized photo-luminescence (PL) measured from a $Ce^{3+}$ doped calcium silicate phosphor of the present invention, compared with orange light emitting $Eu^{2+}$ doped $Sr_3SiO_5$ and $Eu^{2+}$ doped $Sr_2SiO_4$ phosphors prepared in comparative examples. Referring to FIG. 3, the orange light emitting $Eu^{2+}$ doped strontium silicate phosphors have less light emission strength in the green region of the visible spectrum (i.e., near 530 nm), which can cause poor color rendering. The light emitting $Ce^{3+}$ doped calcium silicate phosphor of the present invention provides light emission across the visible spectrum at a wider range of wavelengths and with excellent light emission strength from the green to red regions of the visible spectrum. The light emitting $Ce^{3+}$ doped calcium silicate phosphor of the present invention exhibited a broader light emission band than either of the $Eu^{2+}$ doped $Sr_2SiO_4$ or $Sr_3SiO_5$ phosphors.

Figure 4:
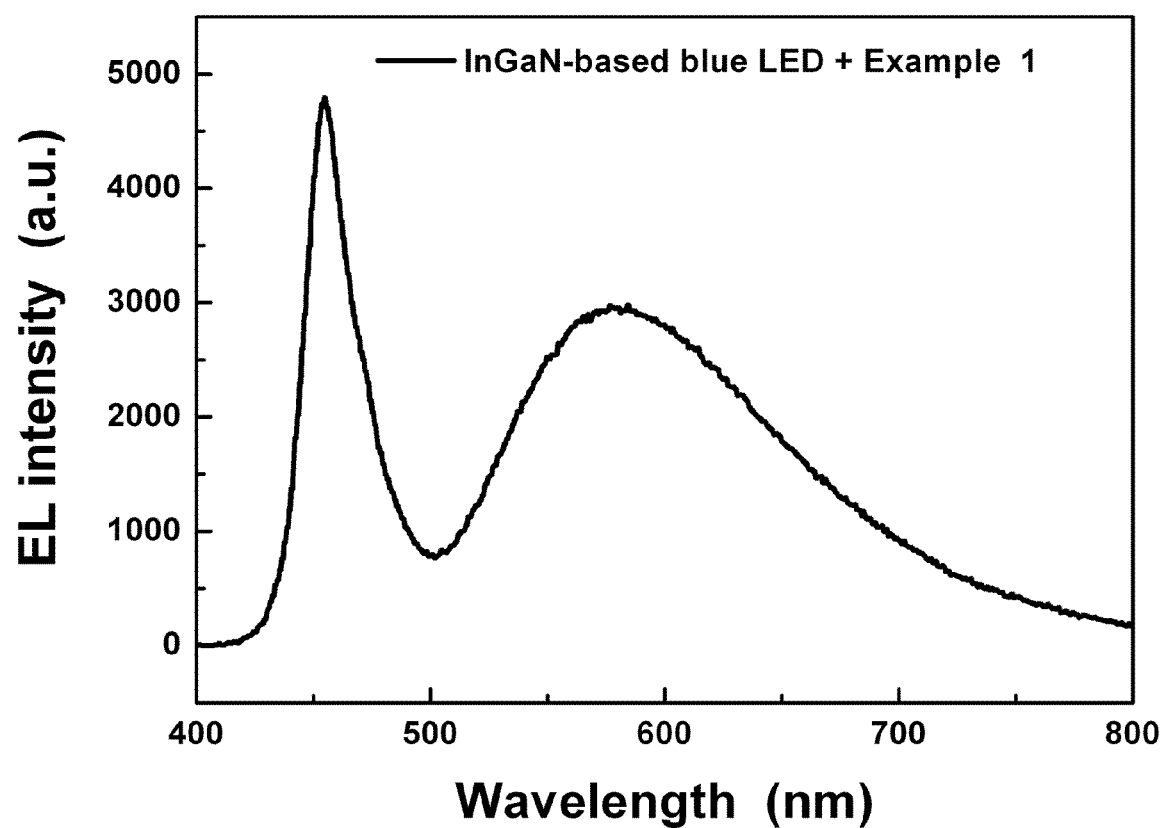
FIG. 4 is a graph showing a light emission spectrum of a white LED comprising $Ce^{3+}$ doped calcium silicate phosphor and a blue LED according to the present invention.

FIG. 4 provides a graph showing a light emission spectrum of a white light emitting LED manufactured by coating an InGaN light emitting diode chip having a main emission peak at about 455 nm with the yellow emitting $Ce^{3+}$ doped calcium silicate phosphor according to the present invention. The bold line (———) in FIG. 4 shows the intensity of light emission across the visible spectrum for the white light emitting diode. The formula of the $Ce^{3+}$ doped calcium silicate phosphor according to the present example was $(Ca_{1.968}SiO_4: Ce^{3+}_{0.016},Li^+_{0.0016})$.

Referring to FIG. 4, when excited by a blue light emitting diode chip, the $Ce^{3+}$ doped calcium silicate phosphor according to the present example emitting light across the visible spectrum having a wider wavelength band ranging from about 480 nm to about 800 nm. The white LED prepared using the above phosphor also provided a spectrum having a wide range of emitted wavelengths ranging from about 420 nm to about 800 nm as well as having excellent light emission strength.

EXAMPLE 2

Preparation of White LED Using Near-UV LED and $Ce^{3+}$ Doped Calcium Silicate Phosphor A near-UV white LED was manufactured by using $Ce^{3+}$ doped calcium silicate phosphor prepared in Example 1 and a near-UV LED chip made of GaN having a main peak at about 405 nm, as shown in FIG. 1.

Figure 5:
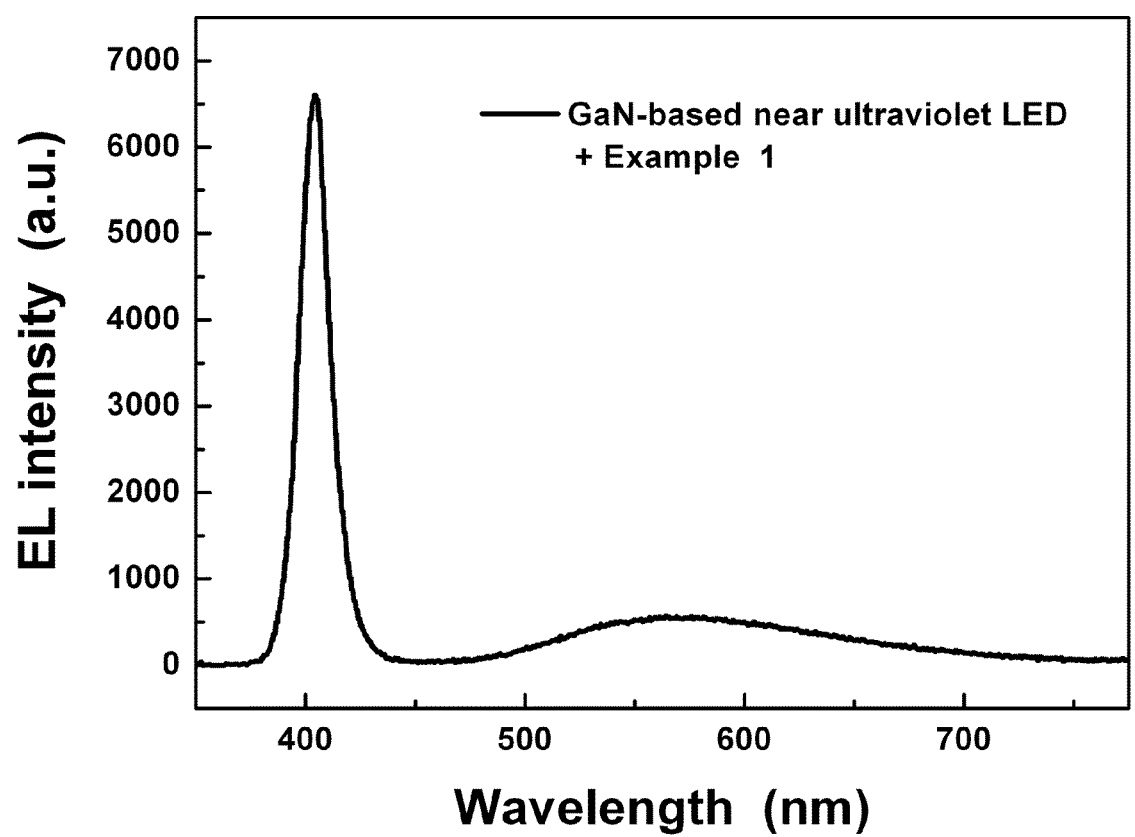
FIG. 5 is a graph showing a light emission spectrum of a white LED comprising $Ce^{3+}$ doped calcium silicate phosphor and a near-UV LED according to the present invention.

FIG. 5 provides a graph showing a light emission spectrum of a white LED manufactured using $Ce^{3+}$ doped calcium silicate phosphor $(Ca_{1.968}SiO_4:Ce^{3+}_{0.016},Li^+_{0.016})$ and a GaN-based near-UV LED according to the present example. When using a GaN or a ZnO based near-UV LED chip, YAG based phosphors substantially neither absorb light nor emit yellow light, thereby not providing sufficient spectral emission for use as a white light emitting diode. In contrast, the $Ce^{3+}$ doped calcium silicate phosphor of the present invention has excellent emission properties across the visible spectrum, even when excited with 405 nm light. Thus, the present invention provides a phosphor that can be combined with a near-UV light source to manufacture a white LED.

The $Ce^{3+}$ doped calcium silicate based yellow phosphor can be prepared according to the present invention, which has a spectrum with a wider band width than commercial silicate phosphors and can efficiently emit yellow light by using a blue LED as an excitation energy source.

The inventive phosphor can also embody white light with high brightness even if the phosphor is applied to a near-UV LED.

When the phosphor of the present invention is employed to produce blue LEDs, near-UV LEDs or light source for backlight units of liquid crystal displays, it can exhibit excellent light emission efficiency and have a wider light emission band so that the phosphor can be efficiently used as light source for backlight units of liquid crystal displays such as lights, notebook computers, and mobile phones, etc.

While the present invention has been described with reference to the preferred examples, it will be understood by those skilled in the art that various modifications and variations can be made therein without departing from the scope of the present invention as defined by the appended claims.

CONCLUSION

These examples illustrate possible embodiments of the present invention. While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

All documents cited herein, including journal articles or abstracts, published or corresponding U.S. or foreign patent applications, issued or foreign patents, or any other documents, are each entirely incorporated by reference herein, including all data, tables, figures, and text presented in the cited documents.

What is claimed is:

1. A light emitting diode comprising:

a light emitting diode chip that emits light having a blue wavelength or a wavelength shorter than that of blue light, wherein the light emitting diode chip has a main emission peak at a wavelength of about 420 nm to about 470 nm; and a $Ce^{3+}$ doped calcium silicate phosphor that is excited by the light emitted from the light emitting diode chip and is represented by the chemical formula:

$$Ca_{2-x-z}SiO_4:Ce^{3+}{}_x,N^+{}_z,$$

wherein x is $0 \leq x \leq 0.5$, z is $0 \leq z \leq 0.5$, and N is at least one metal selected from Li, Na, K and Rb.

2. The light emitting diode according to claim 1, wherein the $Ce^{3+}$ doped calcium silicate phosphor emits light at a wavelength of about 480 nm to about 800 nm when the phosphor is excited by light emitted from the light emitting diode chip.

* * * * *